United States Patent [19]

Banks et al.

[11] Patent Number: 4,529,299
[45] Date of Patent: Jul. 16, 1985

[54] INTERPOSER ELEMENT FOR PHOTOMASKS IN PROJECTION PRINTER

[75] Inventors: Edward L. Banks, Allentown; Thomas S. Ellington, IV, Emmaus; Terrence E. Zavecz, Alburtis, all of Pa.

[73] Assignee: AT&T Technologies, Inc., New York, N.Y.

[21] Appl. No.: 606,790

[22] Filed: May 3, 1984

[51] Int. Cl.³ .............................................. G03B 27/52
[52] U.S. Cl. .................................................... 355/55
[58] Field of Search .................................. 355/53, 55

[56] References Cited

U.S. PATENT DOCUMENTS

| | | | |
|---|---|---|---|
| 2,754,208 | 7/1956 | Conrad | 355/77 |
| 3,379,831 | 4/1963 | Loebach | 430/311 |
| 3,498,713 | 3/1970 | Schlegel et al. | 355/66 |
| 3,659,937 | 5/1972 | Yamanoi | 355/75 |
| 3,951,701 | 4/1976 | Csillag | 148/187 |
| 4,063,812 | 12/1977 | Abraham et al. | 355/18 |
| 4,084,895 | 4/1978 | Ogawa et al. | 355/1 |
| 4,361,643 | 11/1982 | Banks et al. | 430/396 |
| 4,390,273 | 6/1983 | Loebach | 355/125 |

FOREIGN PATENT DOCUMENTS 2845147 1/1980 Fed. Rep. of Germany .
2036367 6/1980 United Kingdom .

*Primary Examiner*—Monroe H. Hayes
*Attorney, Agent, or Firm*—W. O. Schellin; G. W. Houseweart

[57] ABSTRACT

A spacer (52) of an interposer element (51) is placed between support surfaces (27) of a mounting chuck (12) in a projection printer (14) and a photomask (48) which is not protected by a coverplate. The interposer element (51) further features a transparent plate (53) which becomes interposed in the optical path (46) of the projection printer (14) in a position spaced from the photomask (48). The plate (53) shifts the objective focal plane (44) with respect to which the support surfaces (27) are adjusted outward away from an image plane by a distance equal to the shift of the objective focal plane due to the coverplate of a coverplate-protected photomask. Consequently, the spacer (52) features a preferred thickness of a coverplate of such coverplate-protected photomask to position patterns (21) of object features on the unprotected photomask (48) in the plane to which the focal plane is shifted by the interposed plate (53).

13 Claims, 5 Drawing Figures (19)

INTERPOSER ELEMENT FOR PHOTOMASKS IN PROJECTION PRINTER

TECHNICAL FIELD

The present invention relates to an interposer element which is positioned between a photomask and support surfaces of a photomask holder in a projection printer. The invention relates particularly to a compound structure of an interposer element which is advantageously used with unprotected photomasks in a projection printer adapted for photolithographic imaging operations in semiconductor production processes.

BACKGROUND OF THE INVENTION

The semiconductor manufacturing industry makes extensive use of projection printers which feature a high degree in optical precision with the capability of resolving state-of-the art circuit element details having line widths of less than two microns ($2 \times 10^{-6}$ meters).

Typical photo-imaging processes involve the use of photomasks for standard, high volume production runs and of photomasks for specialized, low volume runs. The patterns on photomasks for standard products are advantageously protected by coverplates. Coverplate protection of photomasks is found to be highly desirable in that coverplate-protected photomasks can be expected to last for the entire commercial life cycle of the respective product. In contrast, photomasks for specialized, short-run products often are not protected by coverplates. A major reason for omitting the coverplates from photomasks for newly introduced short-run products is that first generation devices may still include deviations from design requirements. Redesigns may become necessary. In such instances, a fast turnaround time is often essential for the timely commercial introduction of the new devices.

However, intermixing such unprotected photomasks with photomasks protected by state-of-the-art coverplates in consecutive photo-imaging runs of a projection printer brings about time and cost related problems. Each time the operation of the projection printer changes from the use of coverplate-protected photomasks to the unprotected photomasks or back to the operation with the coverplate protected photomasks, an intricate adjustment to the optics of the projection printer becomes necessary. A full cyclical switch from coverplate protected photomasks to unprotected photomasks and back to protected photomasks typically requires about one workday which is then lost to the use of the projection printer for production purposes. Such production losses are highly undesirable.

SUMMARY OF THE INVENTION

The present invention alleviates problems which are associated with prior art photo-imaging processes, as discussed in relationship to the manufacture of semiconductor devices. According to the invention an interposer element for use in conjunction with a photomask which is not protected by a coverplate comprises a spacer of a precise, predetermined thickness between two opposed mounting surfaces. Apertures extend through the spacer between mounting regions of the mounting surfaces. A coverplate of a thickness of said predetermined thickness is mounted to one of said mounting surfaces over a large, central aperture in the spacer.

BRIEF DESCRIPTION OF THE DRAWING

Various features and advantages of the invention may be best understood when the following detailed description of an embodiment of the invention is read in reference to the appended drawing, wherein.

DETAILED DESCRIPTION

Figure 1:
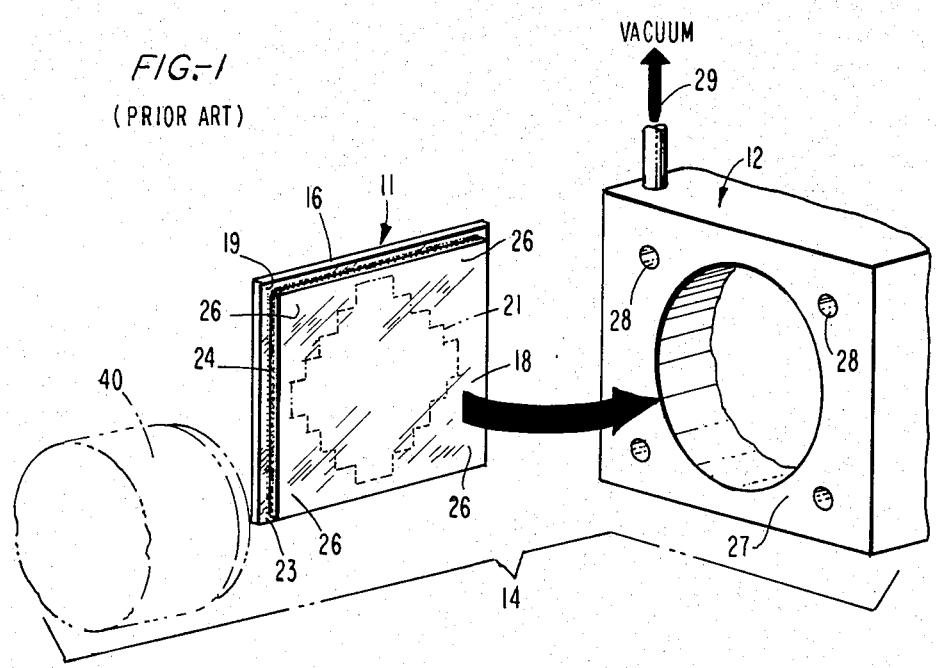
FIG. 1 is a pictorial view of a typical coverplate protected photomask shown in relationship to a photomask mounting chuck of a projection printer.

Referring now to FIG. 1, there is shown a typical photomask 11 in relationship to a photomask holder, typically referred to as a mounting chuck 12, of a projection printer 14 only portions of which are shown in phantom lines to afford a clear view of the photomask 11. The photomask 11 is of a type which is referred to in the art as a "coverplate-protected photomask". The photomask 11 is an assembled structure of a substrate 16 onto which a coverplate 18 is mounted as, for example, in accordance with the teachings of U.S. Pat. No. 4,361,643 to E. L. Banks et al. The coverplate 18 is mounted in the presence of an index matching fluid against an adjacent surface 19 of the substrate 16, such surface 19 bearing certain projectable patterns 21 of object features which represent in the described example one of a series of photomasks which are used in the production of semiconductor devices.

FIG. 1 shows the coverplate 18 to be of a shape similar to the shape of the adjacent substrate 16 yet smaller than that of the substrate 16. Consequently, a peripheral ledge 23 formed about the coverplate supports a fillet 24 (see FIG. 3) of epoxy-type bonding material which permanently holds the coverplate 18 to the substrate 16 and seals in an interfacing film of an index matching fluid. The index matching fluid itself, as an element of the photomask 11, is not separately shown, in that the index matching fluid becomes invisible in the assembly, the fluid having a function of eliminating optical interference patterns at the interface between the substrate 16 and the coverplate 18. Consequently, the substrate 16 and the coverplate 18 of the photomask 11 appear optically to be one and the same body, and the patterns 21 appear to be suspended in a plane within the body of the photomask 11. The terms "optical" or "optics" are used herein with their physical meaning relating to image-forming techniques in conjunction with electromagnetic energy. It should be understood that visible energy or energy with frequencies outside of the visible spectrum may be used for such purposes but that the elements used with any source of a particular wavelength or of a band of wavelengths of energy should be chosen to be compatible with such source.

In addition to a need to consider the compatibility of optical elements with respect to the type of energy source which may be employed, the mechanical structure of a particular type of projection printer typically has an effect on the shape and size of the photomasks. The photomask 11 (see FIG. 1) with respect to which the present invention is described is of substantially square shape and the patterns 21 are located within the confines of a central, circular field of projection. Four corner regions 26 of the coverplate 18 of the coverplate-protected photomask are used for locating and holding the photomask 11 against four corresponding support surfaces 27 of the mounting chuck 12. The support surfaces 27 include open vacuum cavities 28 which are coupled to a typical vacuum source 29 of a state-of-the-art vacuum mounting system. (See FIG. 2).

Figure 2:
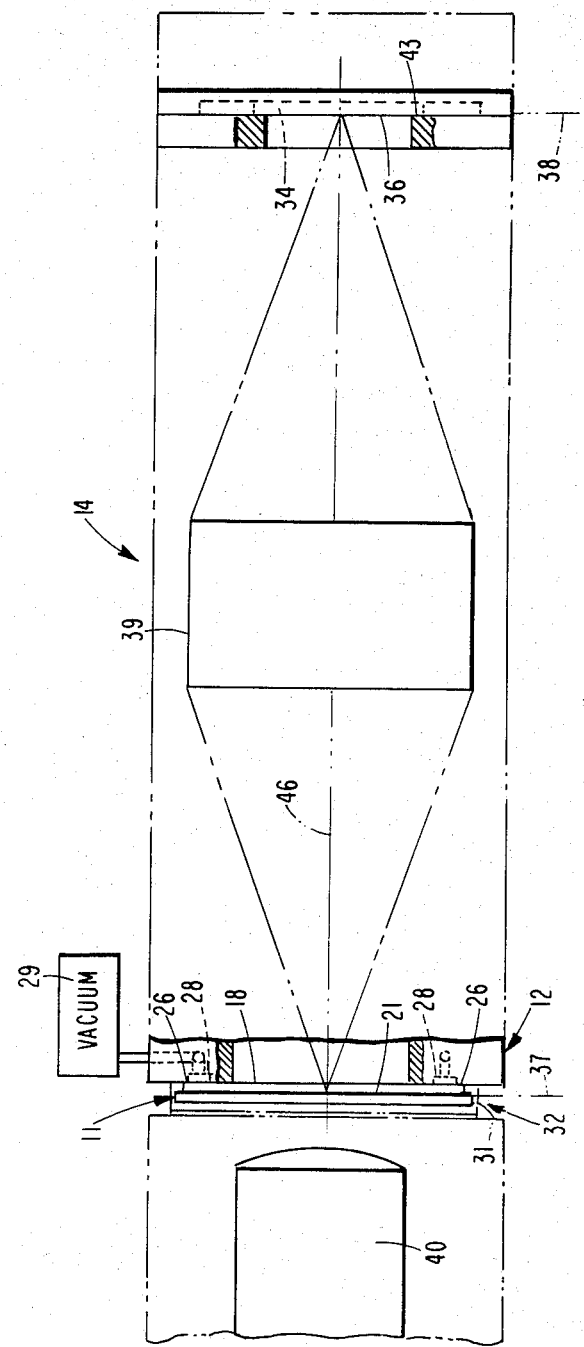
FIG. 2 is a schematic of a typical projection printer illustrating in a simple manner the functional relationship of basic elements of such a projection printer.

FIG. 2 is a schematically simplified representation of a typical, state-of-the-art projection printer 14. The photomask 11, held in a mounting frame 31, is inserted into a port 32 of the projection printer 14 such that the referred-to corner regions 26 become located adjacent to the support surfaces of the mounting chuck 12. A workpiece 34, which is in the described example a semiconductor wafer having a photosensitive surface 36, is similarly loaded into the projection printer 14. When the vacuum source 29 is activated, the surface of the coverplate of the photomask 11 and the photosensitized surface of the wafer 34 are drawn against the respective support surfaces in the projection printer 14. The activation of the vacuum source 29 consequently precisely locates the patterns 21 of the photomask 11 in a shifted object plane 37 and the photosensitized surface 36 of the wafer 34 in an image plane 38 of typical imaging optics 39 of the projection printer 14.

Figure 3:
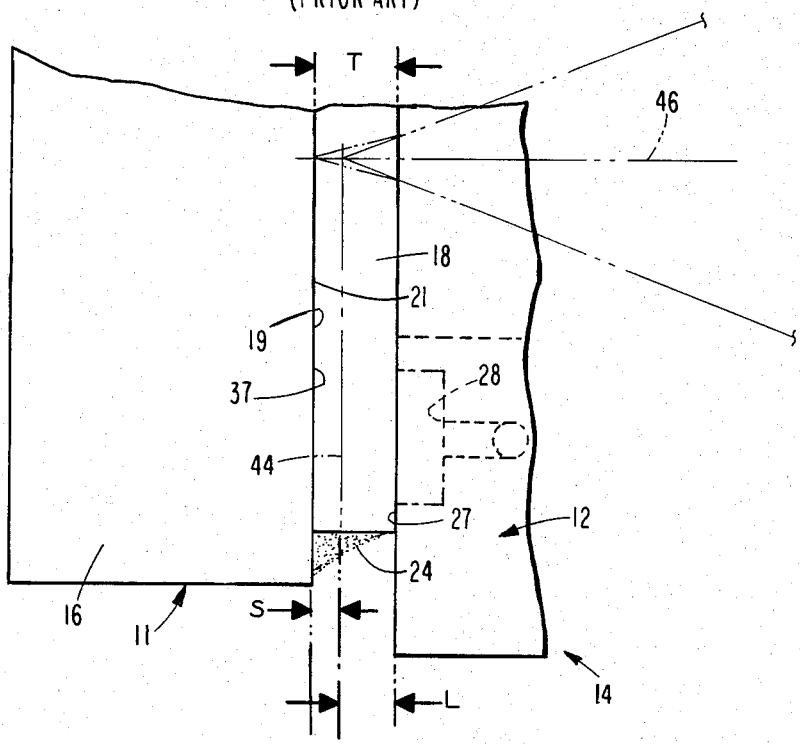
FIG. 3 is an enlarged portion of a photomask mounting chuck of the printer showing its engagement of a typical coverplate-protected photomask, such as shown in FIG. 1.

The imaging optics 39 of the projection printer 14, shown schematically in FIG. 2, may be reflective, refractive or may include a combination of reflective and refractive optical projection elements. The manner in which various elements of the optics 39 are arranged in the projection printer is not considered to have a direct relationship to the invention as will be described herein. Typically a light source 40, when energized, projects an image of the patterns on the photomask 11 into the image plane 38. The image plane 38 coincides with wafer locating surfaces 43. However the support surfaces 27 of the mounting chuck 12 are not adjusted to be coincident with the shifted object plane 37 because of the displacement of the patterns 21 by the presence of the coverplate 18. The spatial relationship between the patterns 21 and the shifted object plane 37 is best explained in reference to FIG. 3 showing a portion of one of the support surfaces 27 of the mounting chuck 12 and a portion of the photomask 11. The coverplate 18 is shown to have a thickness "T". However, the material of the coverplate 18 has an index of refraction which is greater than unity. The precise location to which the object focal plane 44 of the projection printer 14 is adjusted is consequently shifted precisely by a distance "S" into the surface 19 of the substrate 16 because of the refraction introduced into the optical path by the coverplate 18. Optically the amount of the shift can be determined precisely by the formula $$S = T(1 - 1/n)$$

where "T" is the thickness of the coverplate 18 and "n" is the index of refraction of the material of the coverplate. An objective focal plane 44 to which the imaging optics 39 in the projection printer are adjusted is the focal plane at which the object patterns 21 would have to be located in the absence of the coverplate 18 from the optical path 46 between the object plane 37 and the image plane 38 (shown in FIG. 2). FIG. 3 shows such objective focal plane 37 to be displaced from the support surfaces of the mounting chuck 12 by a distance "L". The distance "L" is determined from the thickness "T" of the coverplate 18 from which the amount of the focal shift "S" is subtracted.

A preferred material for the substrate 16 and the coverplate 18 is a low-expansion borosilicate-based glass which is commercially available from Hoya Corporation under the trade designation LE-30 glass. Low thermal expansion characteristics of a material for the photomasks are deemed important in the control of pattern size when the patterns 21 contain the features in accordance with state-of-the-art fine line widths. The LE-30 glass is known to have an index of refraction of 1.546. A coverplate of LE-30 glass having a typical thickness of 0.040 inch shifts the focal plane of the patterns 21 by a distance "S" which amounts to 0.0141 inch. It follows that the distance "L" then equals 0.0259 inch. It is this distance "L" through which the mounting chuck needs to be adjusted, either away from the imaging optics 39 or toward them, each time a change is made in the operation of the projection printer 14 from unprotected photomasks 48 to the coverplate-protected photomasks or vice-versa. In attempting to eliminate adjustments of the projection printer 14, a shim of a size of the photomasks and of a thickness of 0.0259 inch was found to be extremely difficult to handle and to apply to and to transfer between successively used photomasks 48.

Figure 4:
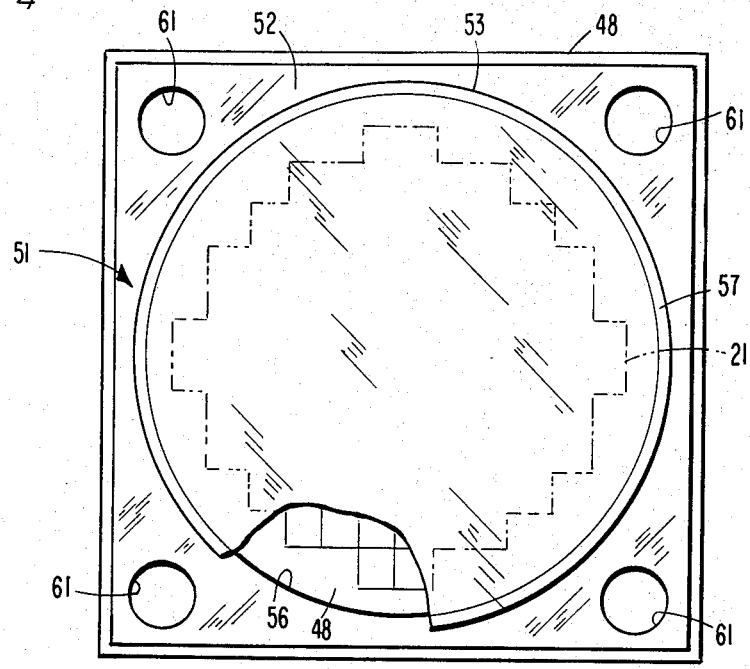
FIG. 4 is a pictorial representation of an interposer element showing features of the present invention.

FIG. 4 shows an interposer element 51 which overcomes various encountered difficulties and which allows the photomask 48 to be inserted into, and used within, the projection printer 14, such that a precisely resolved image of the patterns 21 of the photomask 48 is projected without a need to change the adjustment of the projection printer from that used with the referred-to photomasks 11. The interposer 51 is of a compound structure which includes a spacer 52 and a coverplate 53 which is an optically transparent, plane plate having two parallel, spaced major surfaces. The spacer 52 of the described embodiment has outer dimensions substantially of the same shape and size as those of the unprotected photomask 48. A centrally located aperture 56 through the spacer 52 is of a size somewhat larger than a region within which the projectable patterns 21 are typically generated on the photomask 48. The aperture 56 gives the spacer 52 an annular shape which by itself renders it flimsy and fragile. However, the coverplate 53 is bonded over the aperture 56 and makes the spacer 52 much more rigid. The coverplate 53 is substantially of the same shape as the aperture 56, but is larger than the aperture 56 by an amount sufficient to allow it to cover the aperture and to be attached along its own periphery to the spacer 52 in a peripheral region 57 about the aperture 56.

In the described, preferred embodiment, the aperture 56 and hence the coverplate 53 are of circular shape. The coverplate 53 preferably overlaps the rim of the aperture 56 by a distance approximately equal to the thickness of the coverplate. Thus, when in the assembly of the interposer 51, the coverplate 53 is bonded to the spacer 52 in a position centered over the aperture 56, a thickened rim 58 is formed about the periphery of the aperture 56. The rim 58 features the combined thicknesses of the spacer 52, and the coverplate 53 and at least one fillet 59 (see FIG. 5) of a bonding material, such as an epoxy-type adhesive, which lend strength to the interposer 51. The material continuity of the coverplate 53 spanning across the aperture 56 adds to the strengthening effect of the rim about the aperture 56 to render the interposer 51 manageably rigid.

Figure 5:
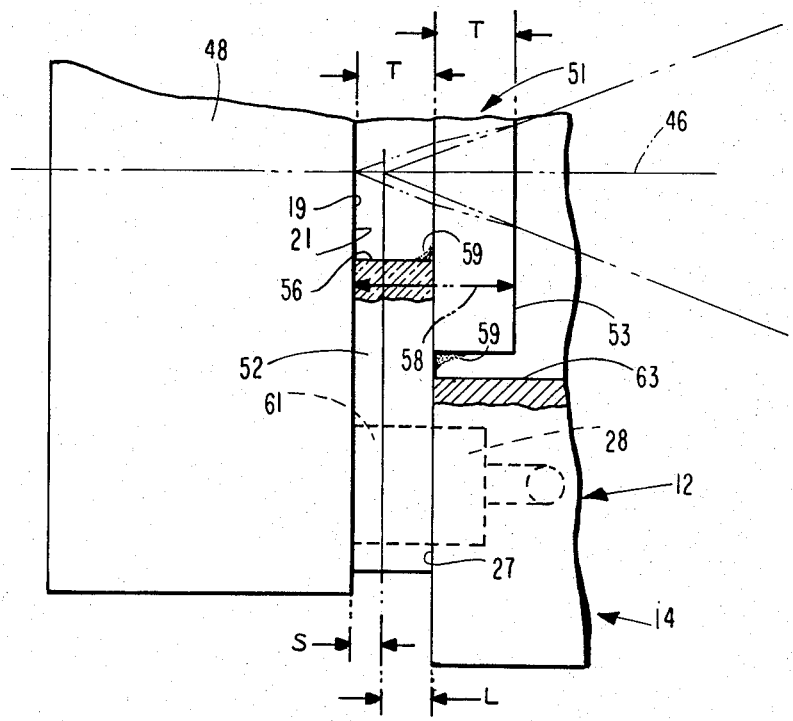
FIG. 5 is a sectional view through the interposer element of FIG. 4, shown in relationship to a photomask which is not protected by a coverplate and to support surfaces of the photomask mounting chuck of the projection printer.

An additional advantage of the described structure is best understood from reference to FIG. 5. The presence of the coverplate 53 in the optical path of the projection printer 14 has the same effect of shifting the objective focal plane outward regardless of where in the optical path the coverplate 53 is located. By being spaced away from the surface 19 of the photomask, the presence of the coverplate does not generate optical interference, which would otherwise require the further interposition of an index matching fluid. Thus, as shown in FIG. 5, to take advantage of the convenient availability of materials for the interposer 51, the thickness of the coverplate 53 is selected to be identical to the thickness "T" of the coverplates 18 of the coverplate-protected photomasks 11. Thus, in addition, the material of the coverplate 53 is the same as that of the coverplates 18, such that the focal shift becomes the same as the inherent focal shift of the coverplate-protected photomasks 18. Instead of having a requirement for spacing the photomasks 48 by 0.0251 inch away from the support surfaces 27 of the mounting chuck 12, the patterns 21, because of the presence of the coverplate 53 of 0.040 inch in the optical path, need to be spaced away from the support surfaces 27 by the same distance as the patterns 21 on the coverplate protected photomasks, namely exactly by the distance "T" or 0.040 inch. The comparatively greater thickness for the spacer 52 dictated by the presence of the coverplate 53 lends further rigidity to the interposer 51.

The described structure of the interposer 51, consequently, has a rigidity which allows the interposer to be transferred between different unprotected photomasks 48 without it becoming damaged. The added rigidity of the spacer 52 tends to reduce the occurrence of molecular bonds between the photomask 48 and the adjacent surface of the spacer 52. To ensure that the photomask 48 is located tightly against the adjacent spacer 52 of the interposer 51, and the interposer itself is located tightly against the support surfaces 27 of the mounting chuck 12, the vacuum from the vacuum cavities 28 is transferred through apertures 61 in the spacer 52 to act directly on the photomask 48. The apertures 61, as shown in FIG. 5, are located in the spacer 52 in alignment with the vacuum cavities 28. Therefore, when the photomask 48 is located together with the interposer 51 adjacent to the mounting chuck 12 and a vacuum is applied to the cavities 28, the apertures 61 become an extension of the vacuum cavities 28. While it may be desirable to have the size and shape of the apertures 61 similar to those of the vacuum cavities 28, such is not an absolute requirement for achieving a desired vacuum pull.

FIG. 5 further illustrates the extension of the coverplate 53 into a central opening or throat 63 in the mounting chuck 12. The size of the coverplate 53 is, consequently, limited to the size of the throat 63 in the mounting chuck 12. It should be understood, however, that the size, shape and location of the various elements described herein are chosen to accommodate the size of the photomask 48 and the peculiar features of an existing projection printer 14, such as one, for example, from the Perkin-Elmer Corporation. Consequently, various changes in the size and shape of the interposer 51 from the described structure are possible and would most likely be recognized as desirable to accommodate various different types of projection printers without departing from the spirit and scope of the invention. For example, it may be desirable to split the described single, annular spacer 52 into separate, adjacent spacers which are all mounted to the coverplate 53, and which are thereby fixed with respect to each other and part of the overall structure of the interposer element 51.

Furthermore, the thicknesses of the spacer 52 and of the coverplate 53 have been chosen to be 0.040 inch and the material of a low expansion LE-30 glass at least in part because of the convenience of having LE-30 type glass available at a thickness of 0.040 inch. It should be realized that these thicknesses are specifically chosen to correspond to the thickness and glass-type of coverplates on existing photomasks 11. It is possible, for example, to change the thickness of the coverplate 53 to 0.050 inch, resulting in an outward focal shift of 0.0176 inch. Adding the shift "S" to the dimension "L", the resulting thickness of the spacer 52 becomes 0.0435 inch. It is seen that such a variation in the described structure would require two different thicknesses of material. A requirement to procure different materials would tend to raise the cost of making such interposer elements. On the other hand, additional strength would be gained.

Changes in the material of the interposer 51 are also possible if refraction index changes are taken into consideration. If the material of the interposer 51 is changed to quartz, which has an index of refraction of 1.467, less than that of the LE-30 glass of coverplates on existing photomasks 11, then the thickness of the coverplate 53 of the interposer 51 is advantageously increased over the thickness of 0.040 inch proportionally to the change in the index of refraction. An increase in the thickness in the coverplate 53 would allow the thickness of the spacer 52 to be retained at 0.040 inch, as described. Of course, various other changes and modifications can be made without departing from the spirit and scope of the invention.

What is claimed is:

1. An interposer element for spacing patterns of object features of a photomask into a focal plane of a projection printer, which comprises:
   a plane, optically transparent plate having a first predetermined thickness between parallel major surfaces thereof and an index of refraction greater than unity; and
   at least one spacer mounted in at least one peripheral region to such plate, said spacer having a second predetermined thickness and a first surface spaced from such plate, such that when the first surface of the spacer is placed against a surface of a photomask having projectable patterns of object features thereon, such patterns become spaced from otherwise adjacent support surfaces of a mounting chuck in a projection printer by a distance equal to a focal shift due to an interposition of such plate into the optical path of the projection printer and a predetermined deviation of said support surfaces of the mounting chuck out of said object plane toward an image plane of the projection printer.

2. An interposer element according to claim 1, wherein the at least one spacer is a spacer having substantially the same outer shape as that determined by outer dimensions of said photomask, and having a central aperture of at least the size of the area on the photomask wherein the patterns are generated, and wherein the plate is bonded to one surface of said spacer to cover said central aperture.

3. An interposer element according to claim 2, wherein said central aperture and said plate are circular in shape and said plate is mounted concentrically over said central aperture.

4. An interposer element according to claim 3, further comprising a plurality of apertures extending through said spacer in peripheral regions about said central aperture and in alignment with vacuum cavities in the support surfaces of the mounting chuck when the interposer element is loaded into the projection printer.

5. An interposer element according to claim 4, wherein said first predetermined thickness between the major surfaces of said plate is equal to the second predetermined thickness of the spacer.

6. An interposer element according to claim 5, wherein the plate is of the same thickness and of the same material as a coverplate mounted over the patterns of object features of a coverplate-protected photomask.

7. An interposer element according to claim 1, wherein said plate extends laterally to cover said patterns of object features of said photomask when said spacer is placed against said photomask, and wherein said surface of the at least one spacer placed against the surface of the photomask contacts the surface of the photomask in surface regions adjacent to regions of the patterns.

8. An interposer element according to claim 1, wherein said plate laterally covers said patterns of object features and is spaced from the surface of the plate supporting such patterns by the thickness of said at least one spacer, said at least one spacer extending in contact with said photomask beyond the lateral confines of such plate.

9. An interposer element according to claim 8, wherein said plate is of circular shape and said at least one spacer is an annular spacer having a central, circular aperture centered on said plate such that the spacer and the plate overlap in an annular bonded rim.

10. An interposer element according to claim 9, wherein the outer shape of the spacer is substantially that of a square and the central aperture is centrally located within such square.

11. An interposer element according to claim 10, wherein the thickness of the spacer is equal to the thickness of the plate.

12. An interposer element according to claim 11, wherein the thickness and the material of the plate are the same as the thickness and material of a coverplate of a coverplate-protected photomask to be used interchangeably with said photomask the patterns of which are located on such one surface thereof.

13. An interposer element according to claim 12, said spacer of which includes a plurality of apertures located coincident with vacuum cavities in the support surfaces of said mounting chuck of said projection printer.

* * * * *